(12) United States Patent
Kim et al.

(10) Patent No.: US 11,487,990 B2
(45) Date of Patent: Nov. 1, 2022

(54) RESISTIVE CROSSBAR ARRAYS WITH REDUCED NUMBERS OF ELEMENTS

(71) Applicant: INTERNATIONAL BUSINESS MACHINES CORPORATION, Armonk, NY (US)

(72) Inventors: Seyoung Kim, White Plains, NY (US); Tayfun Gokmen, Briarcliff Manor, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 636 days.

(21) Appl. No.: 16/441,885

(22) Filed: Jun. 14, 2019

(65) Prior Publication Data

US 2020/0394493 A1 Dec. 17, 2020

(51) Int. Cl.
*G06N 3/04* (2006.01)
*G06N 3/063* (2006.01)
*G11C 13/00* (2006.01)

(52) U.S. Cl.
CPC .............. *G06N 3/04* (2013.01); *G06N 3/0635* (2013.01); *G11C 13/004* (2013.01); *G11C 13/0004* (2013.01); *G11C 13/0011* (2013.01)

(58) Field of Classification Search
CPC ........ G06N 3/063; G06N 3/0635; G06N 3/04; G11C 13/0002; G11C 13/004
See application file for complete search history.

(56) References Cited

U.S. PATENT DOCUMENTS

| | | | |
|---|---|---|---|
| 9,646,243 B1 | 5/2017 | Gokmen | |
| 9,946,551 B2 | 4/2018 | Sato et al. | |
| 2016/0307098 A1 | 10/2016 | Goel et al. | |
| 2017/0109626 A1 | 4/2017 | Gokmen et al. | |
| 2018/0211155 A1 | 7/2018 | Bazrafkan et al. | |
| 2018/0225566 A1* | 8/2018 | Lee | G06N 3/04 |
| 2018/0373975 A1 | 12/2018 | Yu et al. | |
| 2019/0006594 A1 | 2/2019 | Cantin et al. | |
| 2019/0065943 A1 | 2/2019 | Cantin et al. | |
| 2020/0302274 A1* | 9/2020 | Marukame | G06N 3/049 |

OTHER PUBLICATIONS

Kim, Seyoung, et al. "Analog CMOS-based resistive processing unit for deep neural network training." 2017 IEEE 60th International Midwest Symposium on Circuits and Systems (MWSCAS). IEEE, 2017. (Year: 2017).*

Layfun Gokmen et al., "Acceleration of Deep Neural Network Training with Resistive Cross-Point Devices: Design Considerations", Frontiers in Neuroscience, Jul. 2018, vol. 10.

Sijia Liu et al., "A Memristor-Based Optimization Framework for AI Applications", in IEEE Circuits and Systems Magazine, Feb. 2018, vol. 18.

Chenchen Liu et al., "ReRAM-based Circuit and System Design for Future Storage and Computing", 2018 IEEE Asia Pacific Conference on Circuits and Systems, Oct. 2018.

* cited by examiner

*Primary Examiner* — Benjamin P Geib (74) *Attorney, Agent, or Firm* — Tutunjian & Bitetto, P.C.; Randall Bluestone (57) ABSTRACT

Cross-point arrays and methods of updating values of the same include input resistive processing units (RPUs), each having a settable resistance, each connected to a common node. Output RPUs each have a settable resistance and are each connected to the common node. An update switch is configured to connect an update voltage to the common node.

18 Claims, 7 Drawing Sheets

RESISTIVE CROSSBAR ARRAYS WITH REDUCED NUMBERS OF ELEMENTS

BACKGROUND

The present invention generally relates to hardware implementations of artificial neural networks and, more particularly, to hardware implementations that reduced numbers of elements.

An artificial neural network (ANN) is an information processing system that is inspired by biological nervous systems, such as the brain. The key element of ANNs is the structure of the information processing system, which includes a large number of highly interconnected processing elements (called "neurons") working in parallel to solve specific problems. ANNs are furthermore trained in-use, with learning that involves adjustments to weights that exist between the neurons. An ANN is configured for a specific application, such as pattern recognition or data classification, through such a learning process.

Figure 1:
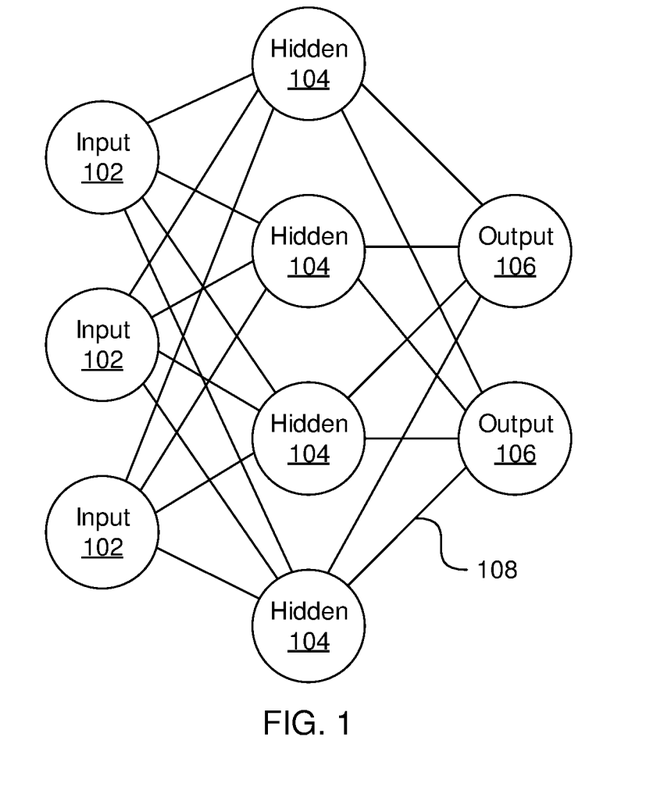
FIG. 1 is a diagram of an exemplary neural network.

Referring now to FIG. 1, a generalized diagram of a neural network is shown. ANNs demonstrate an ability to derive meaning from complicated or imprecise data and can be used to extract patterns and detect trends that are too complex to be detected by humans or other computer-based systems. The structure of a neural network is known generally to have input neurons 102 that provide information to one or more "hidden" neurons 104. Connections 108 between the input neurons 102 and hidden neurons 104 are weighted and these weighted inputs are then processed by the hidden neurons 104 according to some function in the hidden neurons 104, with weighted connections 108 between the layers. There can be any number of layers of hidden neurons 104, and as well as neurons that perform different functions. There exist different neural network structures as well, such as convolutional neural network, maxout network, etc. Finally, a set of output neurons 106 accepts and processes weighted input from the last set of hidden neurons 104.

This represents a "feed-forward" computation, where information propagates from input neurons 102 to the output neurons 106. Upon completion of a feed-forward computation, the output is compared to a desired output available from training data. The error relative to the training data is then processed in "feed-back" computation, where the hidden neurons 104 and input neurons 102 receive information regarding the error propagating backward from the output neurons 106. Once the backward error propagation has been completed, weight updates are performed, with the weighted connections 108 being updated to account for the received error. This represents just one variety of ANN.

SUMMARY

An array includes input resistive processing units (RPUs), each having a settable resistance, each connected to a common node. Output RPUs each have a settable resistance and are each connected to the common node. An update switch is configured to connect an update voltage to the common node.

A neural network reference array includes input RPUs, each having a settable resistance, each connected in parallel to a common node. Output RPUs each have a settable resistance and are each connected in parallel to the common node. An update switch is configured to connect an update voltage to the common node.

A method of updating a weight in a weight array includes closing an update switch that connects a first update voltage to a common node. A second update voltage is applied to a selected one of a set RPUs that are connected in parallel to the common node. Each remaining RPU from the set of RPUs is connected to ground.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Although artificial neural networks (ANN) are conventionally implemented with N×M arrays of weights, this can difficult to implement with large arrays, as the total number of elements increases quadratically. In contrast, the present embodiments use arrays that have 2N elements, with linear increases to the number of elements as larger arrays are used.

Figure 2:
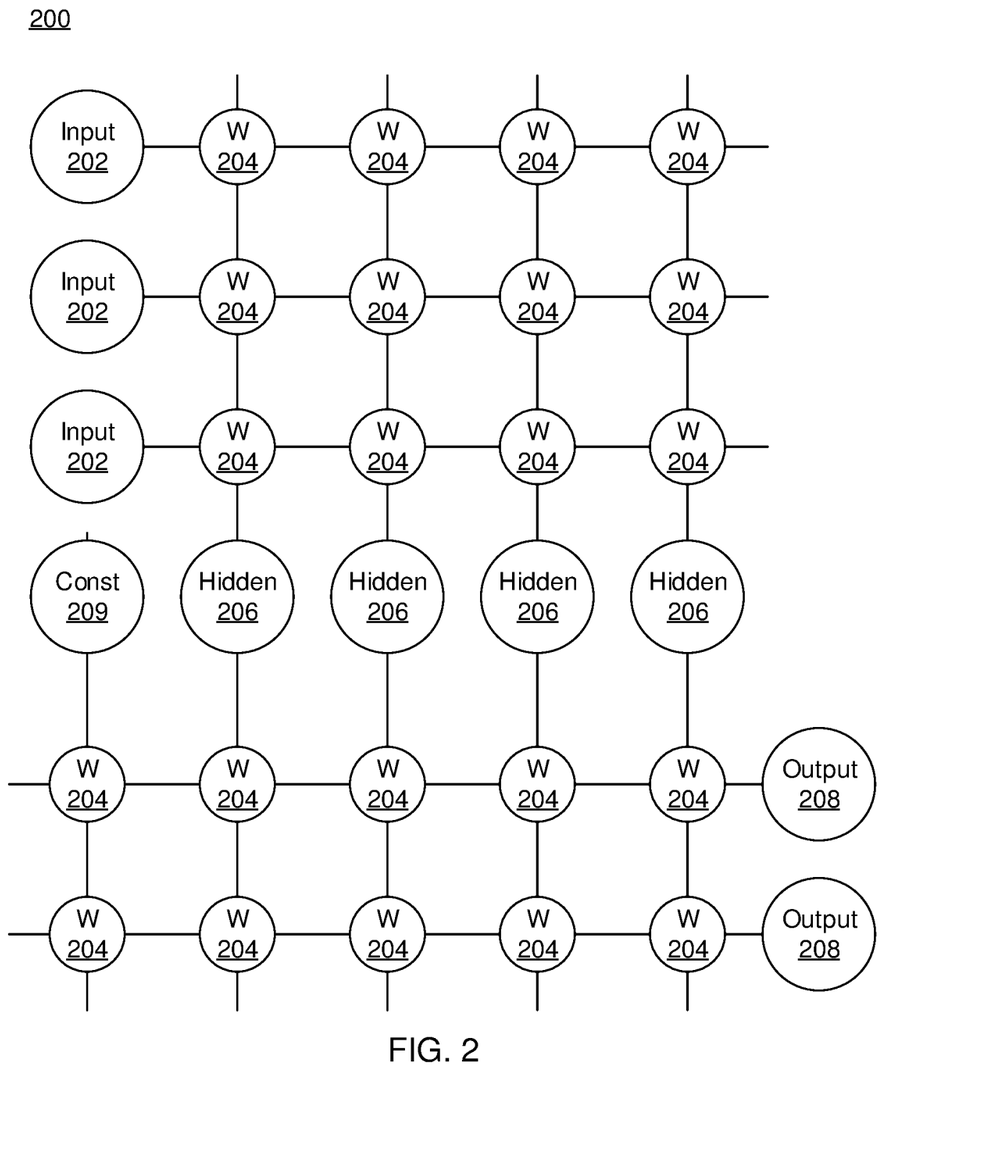
FIG. 2 is a detailed diagram illustrating the structure of an exemplary neural network, including arrays of weights.

Referring now to the drawings in which like numerals represent the same or similar elements and initially to FIG. 2, an artificial neural network (ANN) architecture 200 is shown. It should be understood that the present architecture is purely exemplary and that other architectures or types of neural network can be used instead. In particular, while a hardware embodiment of an ANN is described herein, it should be understood that neural network architectures can be implemented or simulated in software. The hardware embodiment described herein is included with the intent of illustrating general principles of neural network computation at a high level of generality and should not be construed as limiting in any way.

Furthermore, the layers of neurons described below and the weights connecting them are described in a general manner and can be replaced by any type of neural network layers with any appropriate degree or type of interconnectivity. For example, layers can include convolutional layers, pooling layers, fully connected layers, softmax layers, or any other appropriate type of neural network layer. Furthermore, layers can be added or removed as needed and the weights can be omitted for more complicated forms of interconnection.

During feed-forward operation, a set of input neurons 202 each provide an input voltage in parallel to a respective row of weights 204. In the hardware embodiment described herein, the weights 204 each have a settable resistance value, such that a current output flows from the weight 204 to a respective hidden neuron 206 to represent the weighted input. In software embodiments, the weights 204 can simply be represented as coefficient values that are multiplied against the relevant neuron outputs.

Following the hardware embodiment, the current output by a given weight 204 is determined as $$I = \frac{V}{r},$$

where V is the input voltage from the input neuron 202 and r is the set resistance of the weight 204. The current from each weight adds column-wise and flows to a hidden neuron 206. Because conductance values can only be positive numbers, some reference conductance is needed to encode both positive and negative values in the matrix. Some forms of ANN use a set of reference weights that have a fixed resistance to determine positive and negative values of the weights 204, though the embodiments described specifically herein can use of a separate array of reference weights. The currents produced by the weights 204 are continuously valued and positive, and therefore the reference weights are used to provide a reference current, above which currents are considered to have positive values and below which currents are considered to have negative values.

The hidden neurons 206 use the currents from the array of weights 204 to perform some calculation. The hidden neurons 206 then output a voltage of their own to another array of weights 204. This array performs in the same way, with a column of weights 204 receiving a voltage from their respective hidden neuron 206 to produce a weighted current output that adds row-wise and is provided to the output neuron 208.

It should be understood that any number of these stages can be implemented, by interposing additional layers of arrays and hidden neurons 206. It should also be noted that some neurons can be constant neurons 209, which provide a constant output to the array. The constant neurons 209 can be present among the input neurons 202 and/or hidden neurons 206 and are only used during feed-forward operation.

During back propagation, the output neurons 208 provide a voltage back across the array of weights 204. The output layer compares the generated network response to training data and computes an error. The error is applied to the array as a voltage pulse, where the height and/or duration of the pulse is modulated proportional to the error value. In this example, a row of weights 204 receives a voltage from a respective output neuron 208 in parallel and converts that voltage into a current which adds column-wise to provide an input to hidden neurons 206. The hidden neurons 206 combine the weighted feedback signal with a derivative of its feed-forward calculation and stores an error value before outputting a feedback signal voltage to its respective column of weights 204. This back propagation travels through the entire network 200 until all hidden neurons 206 and the input neurons 202 have stored an error value.

During weight updates, the input neurons 202 and hidden neurons 206 apply a first weight update voltage forward and the output neurons 208 and hidden neurons 206 apply a second weight update voltage backward through the network 200. The combinations of these voltages create a state change within each weight 204, causing the weight 204 to take on a new resistance value. In this manner the weights 204 can be trained to adapt the neural network 200 to errors in its processing. It should be noted that the three modes of operation, feed forward, back propagation, and weight update, do not overlap with one another.

As noted above, the weights 204 can be implemented using resistive cross point devices. Such resistive devices can have switching characteristics that have a non-linearity that can be used for processing data. The weights 204 can belong to a class of device called a resistive processing unit (RPU). The RPU devices can be implemented, for example, with resistive random access memory (RRAM), phase change memory (PCM), programmable metallization cell (PMC) memory, or any other appropriate device with settable resistance. Such RPU devices can also be considered as memristive systems.

Figure 3:
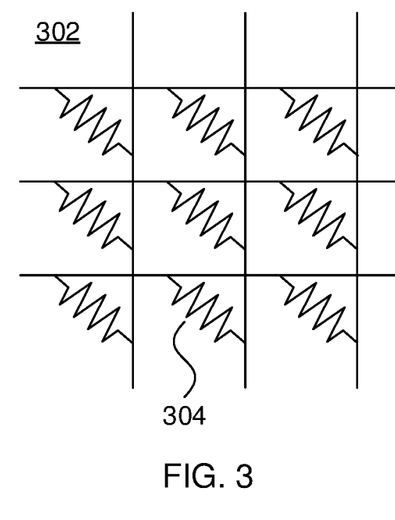
FIG. 3 is a circuit schematic showing an array of weights that are implemented with cross-point resistive processing units.

Referring now to FIG. 3, a diagram shows a reference weight array. A reference weight array 302 is made up of individual reference RPUs 304 and is programmed with a set of fixed resistance values. These fixed resistance values are set to provide a mid-point that is used to compare the values of the weights 204 against (e.g., a value between a logical low and a logical high value). These resistance values are set to provide particular current outputs when a voltage is applied. For example, reading out a particular reference value from the reference weight array 302 and then comparing that reference value to a value read out from a corresponding weight 204 in the ANN 200, determines whether the value read out from the ANN 200 is positive or negative. Although a 3×3 array is shown, it should be understood that reference arrays of any appropriate size can be used to match a size of a corresponding array of weights 204.

Figure 4:
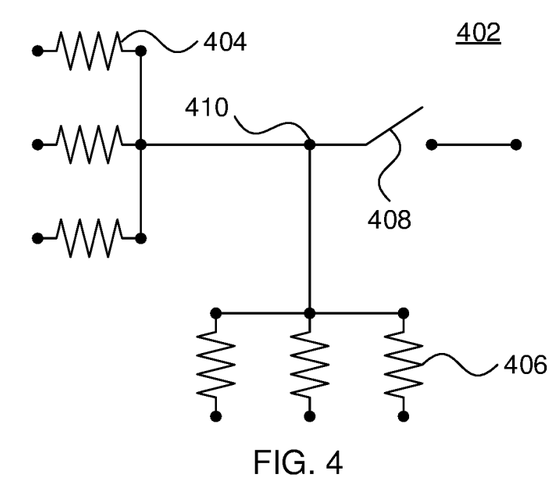
FIG. 4 is a circuit schematic showing an array of weights implemented with a reduced number of resistive processing units in accordance with an embodiment of the present invention.

Referring now to FIG. 4, a reference weight array 402 is shown that uses only 2N RPUs. In this case, instead of using a 3×3 array of RPUs, two banks of 3 RPUs are used to handle row inputs 404 and column outputs 406. A voltage is applied to a particular row RPU 404 and a current is read out from a particular column RPU 406 to read what would otherwise be implemented as the weight 304 at a corresponding row-and-column in an N×N weight array. The RPUs that are not being read or updated at a given time can be connected to ground.

An update switch 408 is used to enable an update operation for particular RPUs. When the update switch 408 is engaged and an update voltage is applied at the same time that a voltage is applied at a row RPU 404 or a column RPU 406, then the voltage across the RPU is large enough to set a resistance of the device. The update circuit can be implemented using any appropriate switch circuitry such as, for example, a transistor.

The row RPUs 404 and the column RPUs 406, along with the update switch 408, are connected to a common node 410. Currents pass from the row RPUs 404, through the common node 410, and out to the column RPUs 406 during a read operation. A combined update voltage from an RPU and the update node, via the update switch 408, connects through the common node 410. Although the present embodiments are described with respect to arrays that use the row RPUs 404 as inputs and the column RPUs 406 as outputs, it should be understood that these roles can be reversed without affecting the operational principles of the present embodiments.

Although the present embodiments are described with a particular focus on reference arrays, it should be understood that the present architecture can be used to implement any weight array. Reference arrays are particularly contemplated because they are generally set once, and their values are rarely changed thereafter. During a weight update, the present embodiments have more paths to ground, which results in a higher power draw relative to an N×N array of weights. Thus, in applications where the weights are rarely updated, the present embodiments reduce the number of elements needed with few drawbacks.

Figure 5:
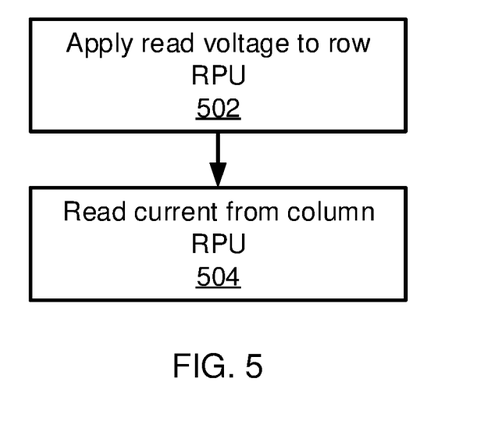
FIG. 5 is a block/flow diagram of a method of reading a value from an array of weights implemented with a reduced number of resistive processing units in accordance with an embodiment of the present invention.

Referring now to FIG. 5, a method for reading a value from a 2N array 402 is shown. Block 502 applies a read voltage to a row RPU 404 and block 504 reads the resulting current at a column RPU 406. The result is a current that has passed through both the row RPU 404 and the column RPU 406 in serial. Because the values of the row RPUs 404 and the column RPUs 406 are set appropriately, the result is indistinguishable from a current that is read out from an N×N array 302.

Figure 6:
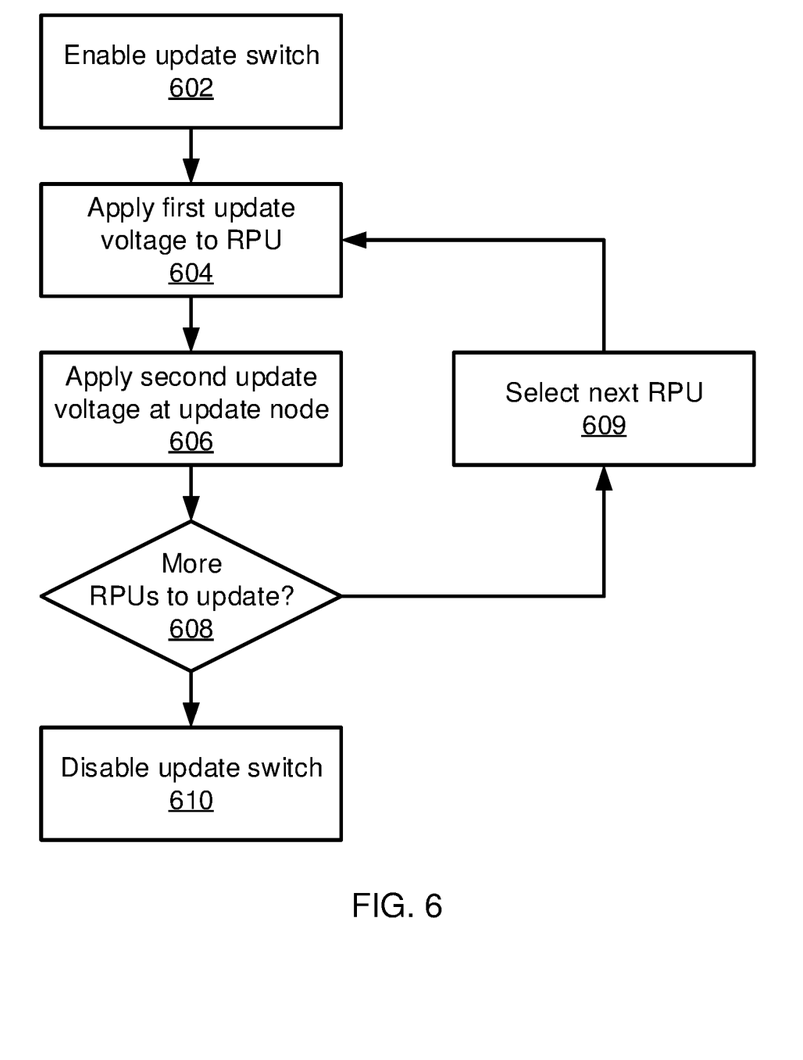
FIG. 6 is a block/flow diagram of a method of updating a value from an array of weights implemented with a reduced number of resistive processing units in accordance with an embodiment of the present invention.

Referring now to FIG. 6, a method for updating a value in a 2N array 402 is shown. Block 602 enables the update switch 408, for example by applying an above-threshold voltage to a switch transistor. This connects an update node to the array. Block 604 applies a first update voltage to the RPU (whether a row RPU 404 or a column RPU 406) and block 606 applies a second update voltage to the update node through the update switch 408. The combined voltages (e.g., one positive, one negative) across the RPU being updated is sufficient to change a resistive state of the RPU. For the other RPUs in the array, the total voltage across them will be below the update threshold voltage and their resistive states will not change.

Block 608 determines whether there are more RPUs to update. If so, block 609 selects a next RPU and processing returns to block 604. If not, block 610 disables the update switch so that normal read operation can resume.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 7:
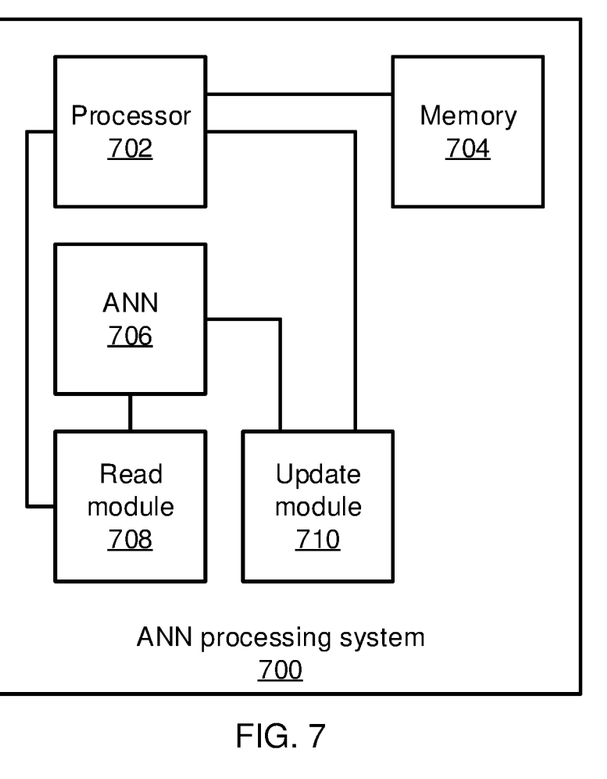
FIG. 7 is a block diagram of an artificial neural network processing system that includes an array of weights implemented with a reduced number of resistive processing units in accordance with an embodiment of the present invention.

Referring now to FIG. 7, an ANN processing system 700 is shown. The system 700 includes a hardware processor 702 and memory 704. An ANN 706 is implemented using hardware weights in the form of, e.g., RPUs, that have a settable resistance. At least one weight array in the ANN 706 is implemented using a 2N weight array in the manner described above at least with respect to FIG. 4, though it should be understood that the array can include any number of row RPUs 404 and column RPUs 406.

The ANN processing system 700 can further include one or more functional modules that can, in some embodiments, be implemented as software that is stored in memory 704 and that is executed by processor 702. In other embodiments, one or more of the modules can be implemented as one or more discrete hardware components in the form of, e.g., application specific integrated chips or field programmable gate arrays.

A read module 708 operates to read stored values from the ANN by, e.g., applying a read voltage to an appropriate row RPU 404 in a weight array and reading out a current at a corresponding column RPU 406. The current that is read out depends on the applied voltage and the combined resistances of the two RPUs. The read module 708 can therefore include ammeter circuitry to measure a current. An update module 710 engages an update switch 408 in the weight array and applies an update voltage to the update node and to an RPU to be updated.

Figure 8:
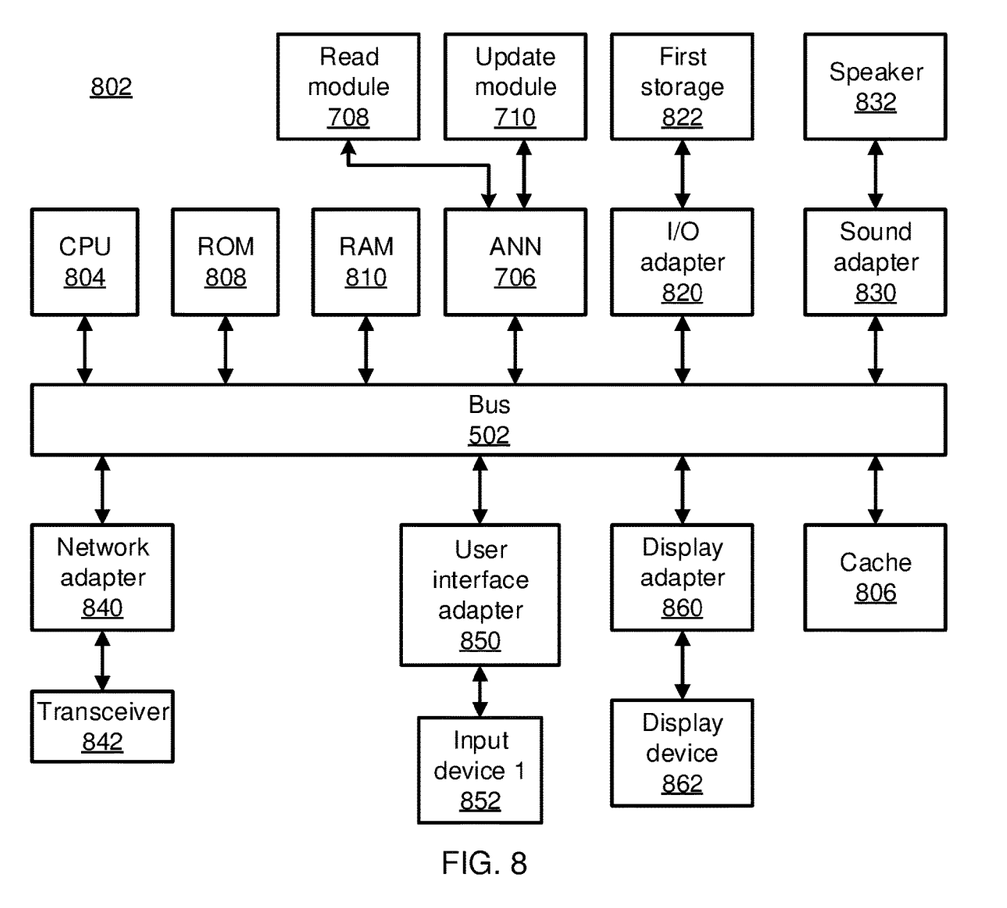
FIG. 8 is a block diagram of an artificial neural network processing system that includes an array of weights implemented with a reduced number of resistive processing units in accordance with an embodiment of the present invention.

Referring now to FIG. 8, an exemplary processing system 800 is shown which may represent the ANN processing system 700. The processing system 800 includes at least one processor (CPU) 804 operatively coupled to other components via a system bus 802. A cache 806, a Read Only Memory (ROM) 808, a Random Access Memory (RAM) 810, an input/output (I/O) adapter 820, a sound adapter 830, a network adapter 840, a user interface adapter 850, and a display adapter 860, are operatively coupled to the system bus 802.

A first storage device 822 is operatively coupled to system bus 802 by the I/O adapter 820. The storage device 822 can be any of a disk storage device (e.g., a magnetic or optical disk storage device), a solid state magnetic device, and so forth. The storage device 822 can be the same type of storage device or different types of storage devices.

A speaker 832 is operatively coupled to system bus 802 by the sound adapter 830. A transceiver 842 is operatively coupled to system bus 802 by network adapter 840. A display device 862 is operatively coupled to system bus 802 by display adapter 860.

A first user input device 852 is operatively coupled to system bus 802 by user interface adapter 850. The user input device 852 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present principles. The user input device 822 can be the same type of user input device or different types of user input devices. The user input device 852 is used to input and output information to and from system 800.

Of course, the processing system 800 may also include other elements (not shown), as readily contemplated by one of skill in the art, as well as omit certain elements. For example, various other input devices and/or output devices can be included in processing system 800, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 800 are readily contemplated by one of ordinary skill in the art given the teachings of the present principles provided herein.

Having described preferred embodiments of resistive crossbar arrays with reduced numbers of elements (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An array, comprising:
    a plurality of input resistive processing units (RPUs), each having a settable resistance, each connected to a common node;
    a plurality of output RPUs, each having a settable resistance, each connected to the common node, wherein a single input RPU is connected to an input voltage and a single output RPU is connected to an ammeter during a read operation; and
    an update switch that is configured to connect an update voltage to the common node.

2. The array of claim 1, wherein a voltage applied to an updating RPU selected from the plurality of input RPUs and the plurality of output RPUs, combined with the update voltage, changes a settable resistance of the updating RPU.

3. The array of claim 1, wherein the plurality of input RPUs are connected in parallel to the common node.

4. The array of claim 1, wherein the plurality of output RPUs are connected in parallel to the common node.

5. The array of claim 1, wherein a remainder of the plurality of input RPUs and a remainder of the plurality of output RPUs are connected to ground during the read operation.

6. The array of claim 1, wherein the update switch is closed to connect an update voltage to the common node and a single RPU from the plurality of input RPUs and the plurality of output RPUs is connected to a second update voltage during an update operation.

7. The array of claim 6, wherein a remainder of the input RPUs and the output RPUs are connected to ground during the update operation.

8. The array of claim 1, wherein each RPU in the plurality of input RPUs and the plurality of output RPUs is a device selected from the group consisting of a resistive random access memory, phase change memory, and a programmable metallization cell memory.

9. A neural network reference array, comprising:
    a plurality of input resistive processing units (RPUs), each having a settable resistance, each connected in parallel to a common node;
    a plurality of output RPUs, each having a settable resistance, each connected in parallel to the common node, wherein a single input RPU is connected to an input voltage and a single output RPU is connected to an ammeter during a read operation; and
    an update switch that is configured to connect an update voltage to the common node.

10. The array of claim 9, wherein a voltage applied to an updating RPU selected from the plurality of input RPUs and the plurality of output RPUs, combined with the update voltage, changes a settable resistance of the updating RPU.

11. The array of claim 9, wherein a remainder of the plurality of input RPUs and a remainder of the plurality of output RPUs are connected to ground during the read operation.

12. The array of claim 9, wherein the update switch is closed to connect an update voltage to the common node and a single RPU from the plurality of input RPUs and the plurality of output RPUs is connected to a second update voltage during an update operation.

13. The array of claim 12, wherein a remainder of the input RPUs and the output RPUs are connected to ground during the update operation.

14. A method of updating a weight in a weight array, comprising:
    closing an update switch that connects a first update voltage to a common node; and
    applying a second update voltage to a selected one of a plurality of resistive processing units (RPUs) that are connected in parallel to the common node, wherein each remaining RPU from the plurality of RPUs is connected to ground.

15. The method of claim 14, wherein the first update voltage, combined with the second update voltage, changes a settable resistance of the selected RPU.

16. The method of claim 15, wherein the first update voltage, taken without the second update voltage, is insufficient to change the settable resistance of the selected RPU.

17. The method of claim 14, further comprising opening the update switch after applying the second update voltage.

18. The method of claim 14, further comprising repeating applying a second update voltage to each of the remaining RPUs from the plurality of RPUs, one at a time.

* * * * *